US010498292B1

(12) United States Patent
Krvavac et al.

(10) Patent No.: US 10,498,292 B1
(45) Date of Patent: Dec. 3, 2019

(54) AMPLIFIERS AND AMPLIFIER MODULES HAVING STUB CIRCUITS

(71) Applicant: NXP USA, INC., Austin, TX (US)

(72) Inventors: Enver Krvavac, Kildeer, IL (US); Joseph Gerard Schultz, Wheaton, IL (US); Yu-Ting David Wu, Schaumburg, IL (US); Nick Yang, Wilmette, IL (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/004,553

(22) Filed: Jun. 11, 2018

(51) Int. Cl.

| H03F 1/02 | (2006.01) |
|---|---|
| H03F 1/56 | (2006.01) |
| H03F 3/195 | (2006.01) |
| H03F 3/21 | (2006.01) |
| H03F 3/60 | (2006.01) |
| H03F 3/213 | (2006.01) |
| H05K 1/02 | (2006.01) |
| H01P 3/08 | (2006.01) |
| H05K 1/18 | (2006.01) |
| H04W 84/04 | (2009.01) |
| H01L 25/16 | (2006.01) |

(52) U.S. Cl.
CPC .......... *H03F 1/0288* (2013.01); *H01P 3/08* (2013.01); *H03F 1/56* (2013.01); *H03F 3/195* (2013.01); *H03F 3/213* (2013.01); *H05K 1/0243* (2013.01); *H05K 1/181* (2013.01); *H01L 25/16* (2013.01); *H03F 2200/222* (2013.01); *H03F 2200/451* (2013.01); *H04W 84/042* (2013.01); *H05K 2201/10166* (2013.01)

(58) Field of Classification Search
USPC .................. 330/295, 124 R, 84, 286, 302
See application file for complete search history.

(56) References Cited

U.S. PATENT DOCUMENTS

| 7,663,435 B2 | 2/2010 | Kim et al. |
| 9,876,474 B2 * | 1/2018 | Zhang .................. H03F 1/0288 |

FOREIGN PATENT DOCUMENTS

EP         2393201 A1    12/2011

OTHER PUBLICATIONS

Colantonio, P., "GaN Doherty Amplifier With Compact Harmonic Traps", Proceeding of the 3rd European Microwave Integrated Circuits Conference, Oct. 2008.
Inoue, A., "High-Efficiency 0.1 cc Power Amplifier Module for 900 MHz Personal Digital Cellular Telephones"; Special Issue on High Frequency/Speed Devices in the 21st Century; IEICE Trans. Electron., vol. E82-C, No. 11, Nov. 1999.
U.S. Appl. No. 15/846,162, filed Dec. 18, 2017, and entitled Amplifier and Amplifier Modules With Shunt Inductance Circuits That Include HIGH-Q Capacitors.

* cited by examiner

*Primary Examiner* — Hieu P Nguyen

(57) ABSTRACT

An amplifier module is provided. The amplifier module includes a multi-layer printed circuit board (PCB). A first power transistor die is mounted at a top surface of the multi-layer PCB. A second power transistor die is mounted at the top surface of the multi-layer PCB. An impedance inversion element is coupled between an output of the first power transistor die and an output of the second power transistor die. A combining node is formed at the output of the second power transistor die. A stub circuit including a transmission line element is coupled at the combining node.

20 Claims, 4 Drawing Sheets

AMPLIFIERS AND AMPLIFIER MODULES HAVING STUB CIRCUITS

BACKGROUND

Field

This disclosure relates generally to radio frequency (RF) electronic components, and more specifically, to RF amplifiers and amplifier modules having stub circuits.

Related Art

Today, radio frequency (RF) systems are used to provide wireless communication, for example, for cellular telephony, wireless data networks, and radio systems. In wireless communication systems, a power amplifier forms a portion of the last amplification stage in a transmission chain before provision of the amplified signal to an antenna for radiation over the air interface. High gain, high linearity, stability, and a high level of power-added efficiency are characteristics of a desirable amplifier in such wireless communication systems. However, architectures of wireless communication systems present challenges in achieving these characteristics.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In the design of a 90/0 Doherty amplifier, where the phase from the carrier and peaking device to the combining/common node is 90 and 0 degrees respectively, the harmonic loading to the carrier device can be determined by the loading at the combining/common node. For the 90/0 Doherty amplifier, the combining/common node is the output/drain of the peaking amplifier. Peaking amplifiers with high parasitic drain-source capacitance, Cds, will self-terminate high harmonic frequencies to a short. This produces a class F condition at the carrier device and enhances Doherty efficiency. However, for peaking amplifiers with low Cds, such as a low periphery gallium nitride (GaN) power transistor device, the combining node harmonic impedance will be governed by the output transformer, which transforms the combining node fundamental impedance to a 50 Ohm system load. Without proper attention to the combining node harmonic loading, there is potential for improper, or sub-optimal, harmonic loading and thus degraded, or lower than optimal, power and efficiency of the Doherty amplifier.

Generally, there is provided a 90/0 Doherty amplifier implementation that controls $2^{nd}$ and $3^{rd}$ harmonics for optimal performance, efficiency, and power. The amplifier includes a first shorting stub circuit and a second shorting stub circuit coupled in parallel at the combining/common node of the amplifier. The first stub circuit is configured to have an electrical length of approximately 90 degrees and functions as an open circuit at a fundamental frequency, $F_0$, and functions as a second harmonic frequency, $2*F_0$, shunt (short circuit) to the ground reference voltage. Likewise, the second stub circuit is configured to have an electrical length of approximately 60 degrees. The second stub circuit functions as a third harmonic frequency, $3*F_0$, shunt to the ground reference voltage to the output of the peaking amplifier die and as an open circuit to the output of the carrier amplifier die of the Doherty amplifier. A Cds absorbed impedance inverter coupled between outputs of the peaking and carrier amplifiers is used to rotate the $F_0$, $2*F_0$, and $3*F_0$ combining/common node impedance to terminate the carrier amplifier harmonics.

Figure 1:
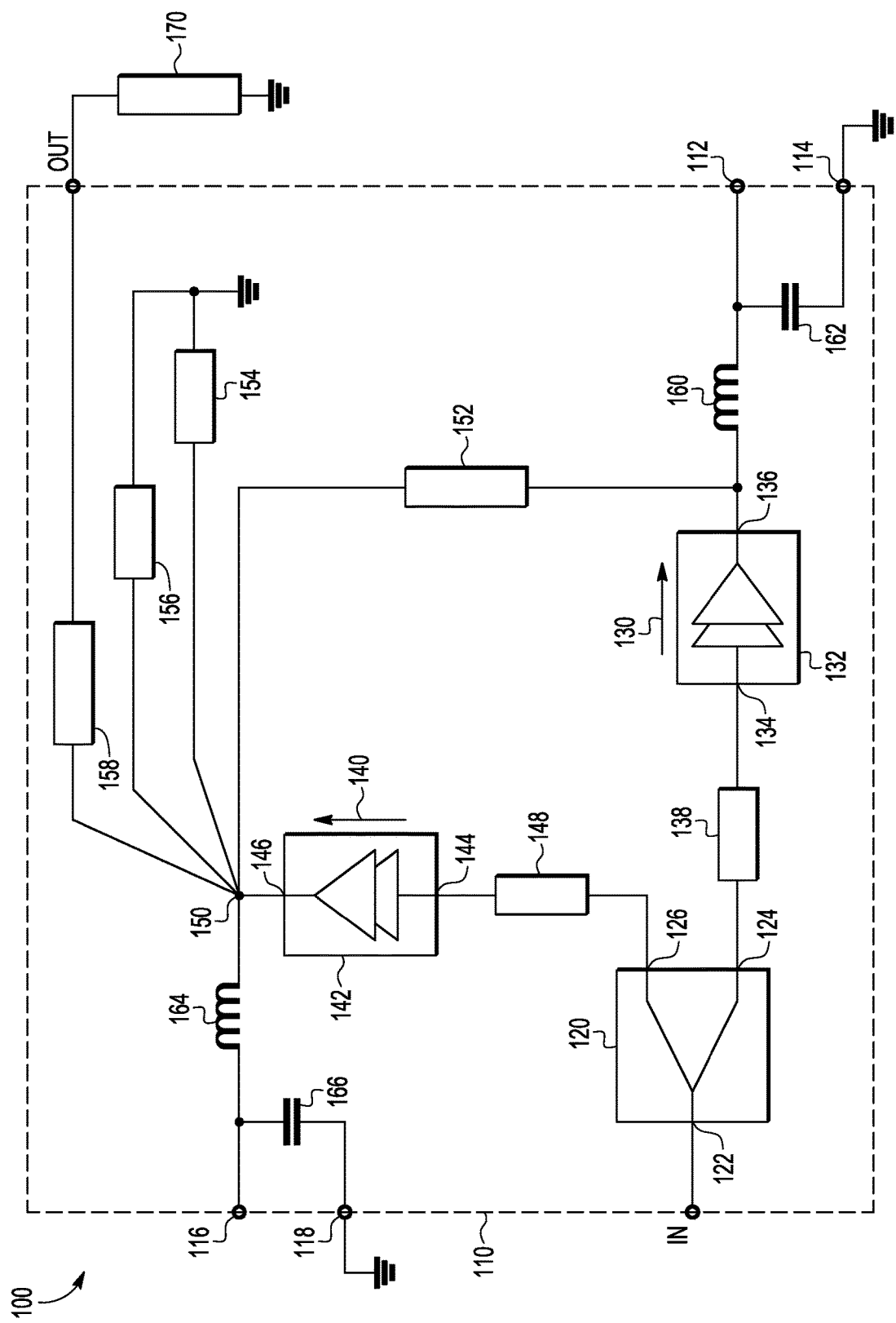
FIG. 1 illustrates, in schematic diagram form, an exemplary Doherty amplifier in accordance with an embodiment.

FIG. 1 illustrates, in schematic diagram form, a Doherty amplifier 100 in accordance with an example embodiment. As indicated in FIG. 1 with dashed box 110, some or all components of Doherty amplifier 100 may be implemented in a single device package or module. In accordance with various embodiments, orienting the various amplifier components to establish an angular offset between portions of the carrier and peaking amplifier signal paths (e.g., paths 130, 140) may have the beneficial effect of reducing package or module size and coupling between signals carried along the carrier and peaking paths.

Doherty amplifier 100 includes an RF input terminal labeled IN, an RF output terminal labeled OUT, a power splitter 120, a carrier amplifier path 130, a peaking amplifier path 140, an inversion element 152, a combining node 150, first and second stub circuits 154, 156, and output transformer 158 in an embodiment. In addition, shunt circuits including shunt inductance elements 160, 164 and shunt capacitance elements 162, 166 are coupled to the carrier and peaking amplifier paths 130, 140 to enable design flexibility in the physical and electrical length of the inversion element 152.

When incorporated into an RF system, the RF input terminal IN is coupled to an RF signal source (not shown), and the RF output terminal OUT is coupled to a load 170 (e.g., an antenna or other load). The RF signal source provides an input RF signal, which is an analog signal that includes spectral energy that typically is centered around one or more carrier frequencies. Fundamentally, the Doherty amplifier 100 is configured to amplify the input RF signal, and to provide an amplified RF signal at the RF output terminal OUT.

The power splitter 120 has an input 122 and two outputs 124, 126, in an embodiment. The power splitter input 122 is coupled to the RF input terminal IN to receive the input RF signal. The power splitter 120 is configured to divide the RF input signal received at input 122 into first and second RF signals (or carrier and peaking signals), which are provided to the carrier and peaking amplifier paths 130, 140 through outputs 124, 126 respectively. According to an embodiment, the power splitter 120 includes a first phase shift element, which is configured to impart a first phase shift (e.g., about a 90-degree phase shift) to the peaking signal before it is provided to output 126. Accordingly, at outputs 124 and 126, the carrier and peaking signals may be about 90 degrees out of phase from each other.

When Doherty amplifier 100 has a symmetrical configuration (i.e., a configuration in which the carrier and peaking amplifier power transistors are substantially identical in size), the power splitter 120 may divide or split the input RF signal received at the input 122 into two signals that are very similar with, in some embodiments, equal power. Conversely, when Doherty amplifier 100 has an asymmetrical configuration (i.e., a configuration in which one of the amplifier power transistors, typically the peaking amplifier transistor, is significantly larger), the power splitter 120 may output signals having unequal power.

In some embodiments, the power splitter 120 may be implemented with fixed-value, passive components. In other embodiments, the power splitter 120 may be implemented with one or more controllable variable attenuators and/or variable phase shifters, which enable the power splitter 120 to attenuate and/or phase shift the carrier and peaking signals based on externally-provided control signals.

The carrier amplifier path 130 is configured to amplify the carrier signal from the power splitter 120, and to provide the amplified carrier signal to the combining node 150. Similarly, the peaking amplifier path 140 is configured to amplify the peaking signal from the power splitter 120, and to provide the amplified peaking signal to the combining node 150, where the paths 130, 140 are designed so that the amplified carrier and peaking signals arrive in phase with each other at the combining node 150.

According to an embodiment, the carrier amplifier path 130 includes an input circuit 138 (e.g., including an impedance matching circuit), a carrier amplifier die 132, and inversion element 152. In addition, and according to an embodiment, the carrier amplifier path 130 includes a first shunt circuit coupled between the output of the carrier amplifier die 132 and a terminal 114 configured for coupling with a ground reference voltage.

The carrier amplifier die 132 includes an RF input terminal 134, an RF output terminal 136, and one or more amplification stages coupled between the input and output terminals 134, 136, in various embodiments. The RF input terminal 134 is coupled through input circuit 138 to the first output 124 of the power splitter 120, and thus the RF input terminal 134 receives the carrier signal produced by the power splitter 120.

Each amplification stage of the carrier amplifier die 132 includes a power transistor. Each power transistor of carrier amplifier die 132 may be formed as a field effect transistor (FET) (such as a metal oxide semiconductor FET (MOSFET), a laterally diffused MOSFET (LDMOS FET), a high electron mobility transistor (HEMT), and the like) on a semiconductor substrate. Alternatively, each of the power transistors may be formed as a bipolar junction transistor (BJT). References herein to a "gate," "drain," and "source," which are commonly used to describe FETs, are not intended to be limiting, as each of these designations has analogous features for BJT implementations. In an embodiment, the carrier amplifier die 132 is formed including a gallium nitride (GaN) substrate. In other embodiments, other suitable substrate materials may be used to form carrier amplifier die 132.

More specifically, each power transistor includes a control electrode (e.g., a gate terminal) and first and second current electrodes (e.g., a drain terminal and a source terminal). In a single-stage device, which would include a single power transistor, the control electrode is electrically connected to the RF input terminal 134, one of the current electrodes (e.g., the drain terminal or the source terminal) is electrically connected to the RF output terminal 136, and the other current electrode (e.g., the source terminal or the drain terminal) is electrically connected to a ground reference voltage (or another reference voltage). In a two-stage device, which would include two power transistors coupled in series, the control electrode of a first transistor is electrically connected to the RF input terminal 134, one of the current electrodes (e.g., the drain terminal or the source terminal) of the first transistor is electrically connected to the control electrode of a second transistor, and one of the current electrodes (e.g., the drain terminal or the source terminal) of a second transistor is electrically connected to the RF output terminal 136.

In addition to the power transistor(s), portions of input and output impedance matching networks and bias circuitry (not shown) also may be monolithically formed as portions of the carrier amplifier die 132 and/or electrically coupled to the carrier amplifier die 132. Further, in an embodiment in which the carrier amplifier die 132 is a two-stage device, an inter-stage matching network (not shown) also may be monolithically formed as a portion of the carrier amplifier die 132.

The RF output terminal 136 of the carrier amplifier die 132 is coupled to the first shunt circuit. The first shunt circuit includes a shunt inductive element 160 (e.g., inductor) coupled in series with a shunt capacitive element 162 (e.g., a DC blocking capacitor). More specifically, the capacitance of the shunt capacitor 162 is chosen to provide a virtual ground reference voltage for the RF electrical signals at terminal 112, such that inductor 160 functions as a shunt inductance to the RF ground voltage. In some embodiments, terminal 112 may be coupled to a bias circuit for providing a DC drain bias voltage to the drain of the carrier amplifier die 132. The series combination of inductor 160 and capacitor 162 is configured to at least partially resonate out the effects of the parasitic drain-source capacitance, Cds, of the transistor of the carrier amplifier die 132. This enables the physical and electrical length of the inversion element 152 to be made longer than it would be if it was required to fully absorb all of the phase introduced by the transistor drain capacitance.

The RF output terminal 136 (e.g., drain terminal) of the carrier amplifier die 132 is coupled to the combining node 150 at the output terminal 146 of the peaking amplifier die 142 by way of inversion element 152, in an embodiment. According to an embodiment, the inversion element 152 functions as a transmission line phase shift element (e.g., impedance inverter) which imparts about a 90-degree relative phase shift to the carrier signal after amplification by the carrier amplifier die 132. A first end of the inversion element 152 is coupled to the RF output terminal 136 of the carrier amplifier die 132, and a second end of the inversion element 152 is coupled to the combining node 150. In an embodiment, inversion element 152 is formed as a microstrip transmission line having a signal conductor formed on a dielectric layer over a ground plane. In other embodiments, inversion element 152 may be formed as a stripline transmission line having the signal conductor formed between an overlying ground plane and an underlying ground plane.

Reference is now made to the peaking amplifier path 140, which includes a peaking amplifier die 142 and an input circuit 148 (e.g., including an impedance matching circuit), in an embodiment. In addition, and according to an embodiment, the peaking amplifier path 140 includes a second shunt circuit coupled between the output of the peaking amplifier die 142 and a terminal 118 configured for coupling with a ground reference voltage.

The peaking amplifier die 142 includes an RF input terminal 144, an RF output terminal 146, and one or more amplification stages coupled between the input and output terminals 144, 146, in various embodiments. The RF input terminal 144 is coupled to the second output 126 of the power splitter 120, and thus the RF input terminal 144 receives the peaking signal produced by the power splitter 120.

As with the carrier amplifier die 132, each amplification stage of the peaking amplifier die 142 includes a power transistor with a control electrode and first and second current electrodes. The power transistor(s) of the peaking amplifier die 142 may be electrically coupled between the RF input and output terminals 144, 146 in a manner similar to that described above in conjunction with the description of the carrier amplifier die 132. Additional other details discussed in conjunction with the description of the carrier amplifier die 132 also apply to the peaking amplifier die 142, and those additional details are not reiterated here for brevity.

The RF output terminal 146 (e.g., drain terminal) of the peaking amplifier die 142 is coupled to the combining node 150. According to an embodiment, the RF output terminal 146 of the peaking amplifier die 142 and the combining node 150 are implemented with a common element. More specifically, in an embodiment, the RF output terminal 146 of the peaking amplifier die 142 is configured to function both as the combining node 150 and as the output terminal 146 of the peaking amplifier die 142. The RF output terminal 146 is additionally configured to enable a connection between the second end of the phase shift and inversion element 152 and the peaking amplifier die 142 (e.g., by way of a wirebond array). Likewise, first ends of first and second stub circuits 154, 156 are coupled at the combining node 150 (e.g., by way of a wirebond array).

The RF output terminal 146 of the peaking amplifier die 142 is coupled to the second shunt circuit. Similar to the first shunt circuit, the second shunt circuit also includes a shunt inductive element 164 (e.g., inductor) coupled in series with a shunt capacitive element 166 (e.g., a DC blocking capacitor). Again, the capacitance of the shunt capacitor 166 is chosen to provide a virtual ground reference voltage for the RF electrical signals at terminal 116, such that inductor 164 functions as a shunt inductance to the RF ground voltage. In some embodiments, terminal 116 may be coupled to a bias circuit for providing a DC bias voltage to the drain of the peaking amplifier die 142.

Once again, the series combination of inductor 164 and capacitor 166 is configured to at least partially resonate out the effects of the parasitic drain-source capacitance, Cds, of the transistor of the peaking amplifier die 142. As with the shunt inductor 142 coupled to the carrier amplifier path 130, the shunt inductor 164 coupled to the peaking amplifier path 140 also enables the physical and electrical length of the phase shift and inversion element 152 to be made longer than it would be if it was required to fully absorb all of the phase introduced by the transistor drain capacitance.

Although first and second shunt circuits may be included in the amplifier 100, in an embodiment, either of the shunt circuits may be excluded from the amplifier 100, in other embodiments. For example, one alternative embodiment of amplifier 100 may include first shunt circuit and may exclude second shunt circuit, while another alternative embodiment of amplifier 100 may include second shunt circuit and may exclude first shunt circuit.

Reference is now made to the output transformer 158. Amplified carrier and peaking RF signals combine in phase at the combining node 150. The combining node 150 is electrically coupled to the RF output terminal OUT to provide the amplified and combined RF output signal to the RF output terminal OUT. The output transformer 158 is coupled between the combining node 150 and the RF output terminal OUT, and functions to present proper load impedances to each of the carrier and peaking amplifier die 132, 142. In an embodiment, the output transformer 158 is an output impedance matching network which transforms the combining node 150 fundamental impedance to a 50 Ohm system load. The resulting amplified RF output signal is produced at RF output terminal OUT, to which an output load 170 (e.g., an antenna) is connected.

Reference is now made to the first and second stub circuits 154, 156. The first and second stub circuits 154, 156 are coupled at the combining node 150 of the amplifier 100. A first end of the first stub circuit 154 is coupled at the combining node 150, and a second end of the first stub circuit 154 is coupled at a ground reference voltage supply terminal. Likewise, a first end of the second stub circuit 156 is coupled at the combining node 150, and a second end of the second stub circuit 156 is coupled at a ground reference voltage supply terminal. According to an embodiment, the first stub circuit 154 may be characterized as a 90-degree shorting stub (e.g., configured to have an electrical length of approximately 90 degrees), and the second stub circuit 156 may be characterized as a 60-degree shorting stub (e.g., configured to have an electrical length of approximately 60 degrees). The 90-degree shorting stub 154 functions as an open at a fundamental frequency, $F_0$, and functions as a $2*F_0$ harmonic frequency shunt to the ground reference voltage supply terminal to the outputs of both the peaking amplifier die 142 and carrier amplifier die 132. The 60-degree shorting stub 156 functions as a $3*F_0$ harmonic frequency shunt to the ground reference voltage supply terminal to the output of the peaking amplifier die 142, and functions as an open to the output of the carrier amplifier die 132.

Although first and second stub circuits 154, 156 may be included in the amplifier 100, in an embodiment, either of the stub circuits may be excluded from the amplifier 100, in other embodiments. For example, one alternative embodiment of amplifier 100 may include first stub circuit 154 and may exclude second stub circuit 156, while another alternative embodiment of amplifier 100 may include second stub circuit 156 and may exclude first stub circuit 154. The first and second stub circuits 154, 156 will be explained in more detail in conjunction with FIG. 2.

Amplifier 100 is configured so that the carrier amplifier path 130 provides amplification for relatively low-level input signals, and both amplification paths 130, 140 operate in combination to provide amplification for relatively high-level input signals. This may be accomplished, for example, by biasing the carrier amplifier die 132 so that the carrier amplifier die 132 operates in a class AB mode and biasing the peaking amplifier die 142 so that the peaking amplifier die 142 operates in a class C mode.

According to an embodiment, the physical components of the carrier and peaking paths 130, 140 are oriented, with respect to each other, so that corresponding portions of the carrier and peaking amplification paths 130, 140 extend in directions that are substantially different from each other. As used herein, the term "signal path" refers to the path followed by an RF signal through a circuit. For example, a portion of a first signal path through the carrier amplifier die 132 extends in a first direction (indicated by arrow 130) between the RF input and output terminals 134, 136. Similarly, a portion of a second signal path through the peaking amplifier die 142 extends in a second direction (indicated by arrow 140) between the RF input and output terminals 144, 146, where the first and second directions are substantially different from each other. In the illustrated embodiment, the first and second directions are perpendicular to each other (i.e., angularly separated by 90 degrees). In other embodiments, the first and second directions may be angularly separated by less or more than 90 degrees. As used herein, the term "substantially different," when referring to the angular separation between directions of corresponding portions of the first and second signal paths, means that the angular separation between the path portions is at least +/−45 degrees.

Figure 2:
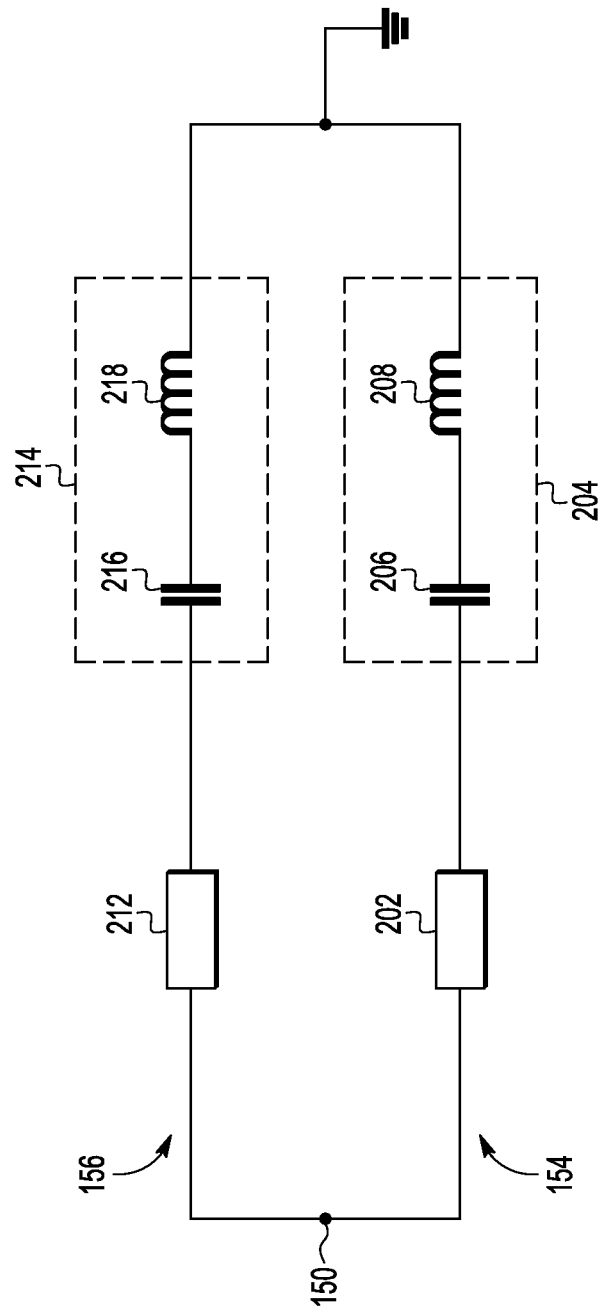
FIG. 2 illustrates, in schematic diagram form, stub circuits in accordance with an example embodiment.

FIG. 2 illustrates, in schematic diagram form, a more detailed depiction of stub circuits 154, 156 in accordance with an example embodiment. First and second stub circuits 154, 156 are coupled between the combining node 150 and a ground reference voltage supply terminal. The first stub circuit 154 includes a transmission line element (e.g., stripline) 202, a capacitive element 206 (e.g., a DC blocking capacitor), and an inductive element 208 (e.g., inductor). A first end of the transmission line element 202 is coupled to the combining node 150, and a second end of the transmission line element 202 is coupled to a first terminal of capacitor 206. A second terminal of capacitor 206 is coupled to a first terminal of inductor 208 and a second terminal of inductor 208 is coupled to a ground reference voltage supply terminal. Although transmission line element 202, capacitor 206 and inductor 208 may be included in the first stub circuit 154, in an embodiment, the inductor 208 may be excluded from the first stub circuit 154, in other embodiments. For example, one alternative embodiment of first stub circuit 154 may include transmission line element 202 and capacitor 206 and may exclude inductor 208. In an embodiment, transmission line element 202 is formed as a stripline transmission line having the signal conductor formed between an overlying ground plane and an underlying ground plane. In other embodiments, transmission line element 202 may be formed as a microstrip transmission line having the signal conductor formed on a dielectric layer over a ground plane.

According to various embodiments, capacitor 206 is selected to be a relatively high-Q surface mount capacitor, such as a metal-insulator-metal (MIM) capacitor, a capacitor integrated within an integrated passive device (IPD), a capacitor integrated within a low-temperature, co-fired ceramic (LTCC) device, or another type of surface mount capacitor with a relatively high Q. Inductor 208 may be formed together with capacitor 206 in a surface mount structure 204, such as those mentioned above. Alternatively, inductor 208 may be implemented as an inductive element separate from surface mount structure 204.

The second stub circuit 156 includes a transmission line element (e.g., stripline) 212, a capacitive element 216 (e.g., a DC blocking capacitor), and an inductive element 218 (e.g., inductor). A first end of the transmission line element 212 is coupled to the combining node 150, and a second end of the transmission line element 212 is coupled to a first terminal of capacitor 216. A second terminal of capacitor 216 is coupled to a first terminal of inductor 218 and a second terminal of inductor 218 is coupled to a ground reference voltage supply terminal. Although transmission line element 212, capacitor 216 and inductor 218 may be included in the second stub circuit 156, in an embodiment, the inductor 218 may be excluded from the second stub circuit 156, in other embodiments as described with stub circuit 154. In an embodiment, transmission line element 212 is formed as a stripline transmission line having the signal conductor formed between an overlying ground plane and an underlying ground plane. In other embodiments, transmission line element 212 may be formed as a microstrip transmission line having the signal conductor formed on a dielectric layer over a ground plane.

As with the stub circuit 154, capacitor 216 is selected to be a relatively high-Q surface mount capacitor, such as a MIM capacitor, a capacitor integrated within an IPD, a capacitor integrated within a LTCC device, or another type of surface mount capacitor. Inductor 218 may be formed together with capacitor 216 in a surface mount structure 214, such as those mentioned above. Alternatively, inductor 218 may be implemented as an inductive element separate from surface mount structure 214.

According to an embodiment, the first stub circuit 154 may be characterized as a 90-degree shorting stub. The dimensions of transmission line element 202 (e.g., stripline length, width, thickness), capacitance value of capacitor 206, and inductance value of inductor 208 are chosen such that first stub circuit 154 has an electrical length of approximately 90 degrees and functions as an open circuit at a fundamental frequency, $F_0$, and functions as a second harmonic frequency, $2*F_0$, shunt to the ground reference voltage. Likewise, the second stub circuit 156 may be characterized as a 60-degree shorting stub. The dimensions of transmission line element 212 (e.g., stripline length, width, thickness), capacitance value of capacitor 216, and inductance value of inductor 218 are chosen such that second stub circuit 156 has an electrical length of approximately 60 degrees and functions as a third harmonic frequency, $3*F_0$, shunt to the ground reference voltage to the output of the peaking amplifier die 142 and as an open circuit to the output of the carrier amplifier die 132. In an embodiment, capacitors 206 and 216 may each have a capacitance value in a range of 5.0 pF to 15.0 pF, and inductors 208 and 218 may each have an inductance value in a range of 0.8 nH to 2.4 nH. In other embodiments, capacitors 206 and 216 may have capacitance values less than 5.0 pF or greater than 15.0 pF, and inductors 208 and 218 may have inductance values less than 0.8 nH or greater than 2.4 nH.

Figure 3:
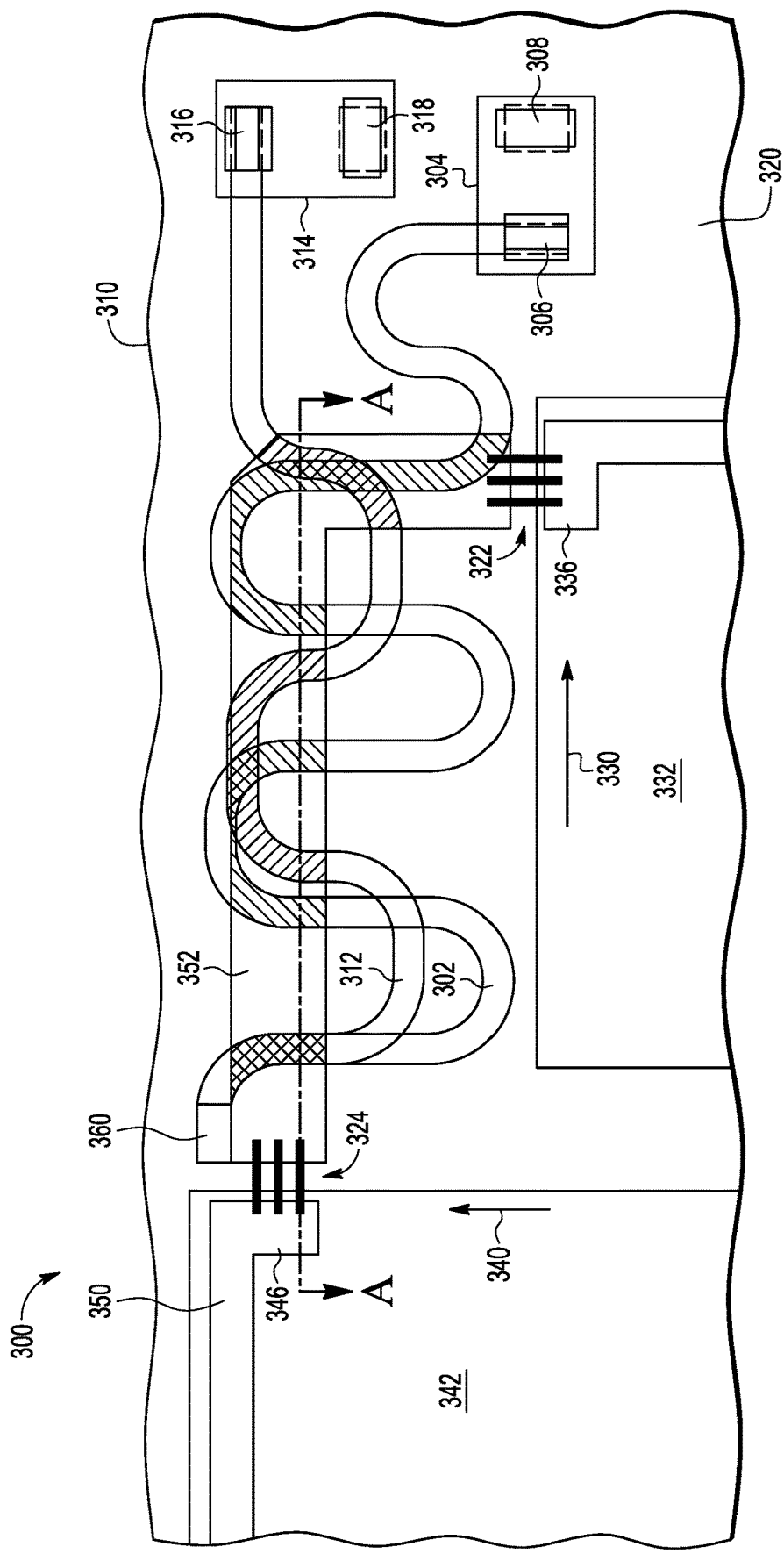
FIG. 3 illustrates, in a plan view, a portion of a Doherty amplifier module implementation including stub circuits in accordance with an example embodiment.
Figure 4:
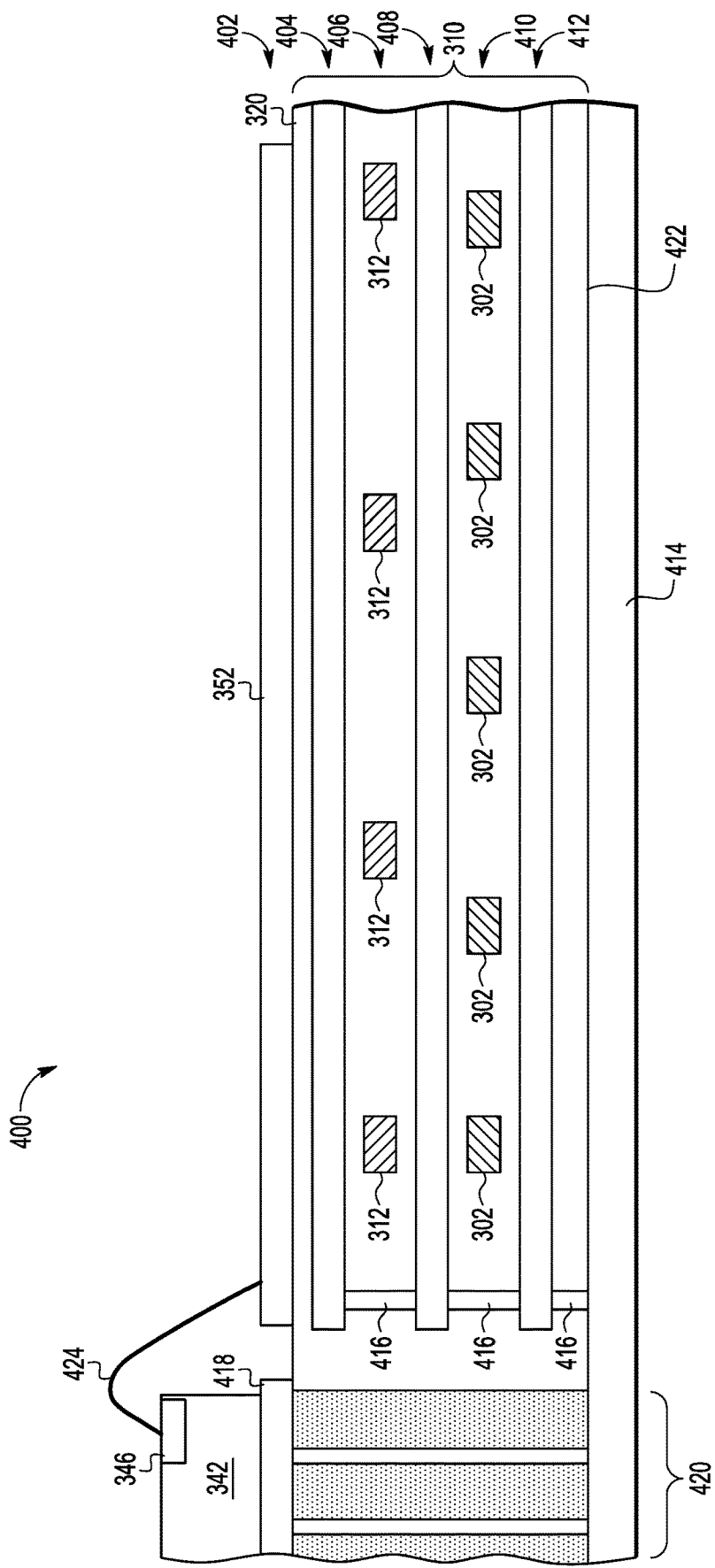
FIG. 4 illustrates, in a cross-sectional view, the portion of a Doherty amplifier module of FIG. 3 along section line A-A.

FIG. 3 and FIG. 4 illustrate, in a plan view and a corresponding cross-sectional view, an embodiment of a physical implementation of the Doherty amplifier 100. FIG. 3 illustrates, in a plan view, a Doherty amplifier module portion 300 in accordance with an example embodiment. FIG. 3 should be viewed simultaneously with FIG. 4, which illustrates, in a cross-sectional view, the Doherty amplifier module portion 300 of FIG. 3 along section line A-A. Doherty amplifier module portion 300 includes a substrate 310, a carrier amplifier die 332 (e.g., carrier amplifier die 132, FIG. 1), a peaking amplifier die 342 (e.g., peaking amplifier die 142, FIG. 1), a microstrip impedance inverter 352 (e.g., inversion element 152, FIG. 1), a first stripline 302 of a first stub circuit (e.g., transmission line element 202 of stub circuit 154, FIG. 2) coupled to a combing node 350 (e.g., common node) at an output of peaking amplifier die 342, a second stripline 312 of a second stub circuit (e.g., transmission line element 212 of stub circuit 156, FIG. 2) coupled to the combining node, and other module features.

According to an embodiment, the substrate 310 is a multi-layer organic substrate formed from printed circuit board (PCB) materials having a plurality of conductive layers (e.g., metal) 402-414 which are separated by dielectric material (e.g., Teflon, FR-4). Substrate 310 includes a top mounting surface 320 for mounting components of the Doherty amplifier and a bottom surface 422. A patterned conductive (e.g., metal) layer 402 is formed at the mounting surface 320 which facilitates electrical connection to die (e.g., carrier amplifier die 332, peaking amplifier die 342) and other components that may be mounted to the mounting surface 320. Conductive layer 414 is formed over the bottom surface 422 to facilitate ground reference access to carrier and peaking amplifier die 332, 342 and ground plane portions of conductive layers 404, 408, 412, for example. Conductive die-attach pads (e.g., pad 418) for electrically coupling carrier and peaking amplifier die 332, 342 to the mounting surface 320 are formed from a portion of the patterned top metal layer 402. In an embodiment, microstrip 352 is formed as a signal line from a portion of the patterned metal layer 402 over ground plane portion of conductive layer 404. The signal line portion is separated from the ground plane portion by dielectric material. In other embodiments, microstrip 352 may be formed as a stripline on other conductive layers (e.g., layers 404-412) of the substrate 310. Conductive vias (e.g., vias 416) provide for electrical connectivity between the metal layers 402-414.

In an embodiment, substrate 310 also includes a plurality of electrically and thermally conductive trenches 420 to which the carrier and peaking amplifier die 332, 342 are coupled (e.g., with solder, brazing material, silver sinter, or other die attach materials). The trenches 420 extend through the substrate thickness to provide heat sinks and ground reference access (e.g., by way of conductive layer 414) to the carrier and peaking amplifier die 332, 342. For example, the conductive trenches 420 may be filled with copper or another thermally and electrically conductive material. In alternative embodiments, the trenches 420 may be replaced with conductive slugs (e.g., copper slugs) or with thermal vias.

According to an embodiment, an RF output terminal 336 (e.g., drain) of carrier amplifier die 332 is coupled to a first end of microstrip 352 by way of a first wire bond array 322. An amplified RF carrier signal is produced by the carrier amplifier die 332 at the RF output terminal 336. Accordingly, the signal path through the carrier amplifier die 332 is in a direction extending from an RF input terminal (not shown) toward the RF output terminal 336, which direction is indicated by arrow 330. Likewise, an RF output terminal 346 (e.g., drain) of peaking amplifier die 342 is coupled to a second end of microstrip 352 by way of a second wire bond array 324 (e.g., wire bond 424, FIG. 4). An amplified RF peaking signal is produced by the peaking amplifier die 342 at the RF output terminal 346. The signal path through the peaking amplifier die 342 is in a direction extending from an RF input terminal (not shown) toward the RF output terminal 346, which direction is indicated by arrow 340. The carrier and peaking amplifier die 332, 342 are oriented, with respect to each other, so that corresponding portions of the carrier and peaking signal paths 330, 340 extend in directions that are substantially different from each other. The RF output terminal 346 functions as a combining node 350 (e.g., combining node 150, FIG. 1) at which the amplified peaking signal and delayed carrier amplifier signal are combined in phase.

The first stub circuit (e.g., stub circuit 154, FIG. 2) includes a first stripline 302 (e.g., transmission line element 202 of stub circuit 154, FIG. 2) and a first chip capacitor 304 (e.g., chip capacitor 204 including capacitive element 206 and inductive element 208). According to an embodiment, the stripline 302 is formed on a first inner conductive layer (e.g., metal layer 410). Stripline 302 is formed as a stripline transmission line having the signal conductor portion formed on conductive layer 410 between overlying ground plane portion of conductive layer 408 and underlying ground plane portion of conductive layer 412. Dielectric material is disposed between the signal conductor portion and the ground plane portions. A first end of the stripline 302 is coupled to the combining node 350 by way of conductive via 360, and a second end of the stripline 302 is coupled to a first terminal of the first chip capacitor 304 at first surface bonding pad 308. The first surface bonding pad 308 may be coupled to the second end of the stripline 302 by way of another conductive via. A second terminal of the first chip capacitor 304 is coupled to a ground reference voltage supply at a second surface bonding pad 308. Although chip capacitor 304 may include a capacitive element (e.g., 206, FIG. 2) and an inductive element (e.g., 208, FIG. 2) in an embodiment, the inductive element may be excluded from the chip capacitor 304, in other embodiments. For example, one alternative embodiment of chip capacitor 304 may include may include a capacitive element (e.g., 206, FIG. 2) and may be formed without inductive element (e.g., 208, FIG. 2). In an embodiment, at least a portion of the microstrip 352 overlaps at least a portion of the first stripline 302.

According to various embodiments, the capacitive element (e.g., 206, FIG. 2) of chip capacitor 304 is selected to be a relatively high-Q surface mount capacitor, such as a MIM capacitor, a capacitor integrated within an IPD, a capacitor integrated within a LTCC device, or another type of surface mount capacitor with a relatively high Q. The inductive element (e.g., 208, FIG. 2) of chip capacitor 304 may be formed together with the capacitive element in the chip capacitor 304. Alternatively, the inductive element may be implemented separate from chip capacitor 304.

The second stub circuit (e.g., stub circuit 156, FIG. 2) includes a second stripline 312 (e.g., transmission line element 212 of stub circuit 156, FIG. 2) and a second chip capacitor 314 (e.g., chip capacitor 214 including capacitive element 216 and inductive element 218). According to an embodiment, the second stripline 312 is formed on a second inner conductive layer (e.g., metal layer 406) different from the first inner conductive layer. Stripline 312 is formed as a stripline transmission line having the signal conductor portion formed on conductive layer 406 between overlying ground plane portion of conductive layer 404 and underlying ground plane portion of conductive layer 408. Dielectric material is disposed between the signal conductor portion and the ground plane portions. A first end of the stripline 312 is coupled at the combining node 350 by way of conductive via 360, and a second end of the stripline 312 is coupled to a first terminal of the second chip capacitor 314 at first surface bonding pad 318. The second surface bonding pad 318 may be coupled to the second end of the stripline 312 by way of another conductive via. A second terminal of the second chip capacitor 314 is coupled to a ground reference voltage supply at a second surface bonding pad 318. Although chip capacitor 314 may include a capacitive element (e.g., 216, FIG. 2) and an inductive element (e.g., 218, FIG. 2) in an embodiment, the inductive element may be excluded from the chip capacitor 314, in other embodiments. For example, one alternative embodiment of chip capacitor 314 may include may include a capacitive element (e.g., 216, FIG. 2) and may be formed without inductive element (e.g., 218, FIG. 2). In an embodiment, at least a portion of the microstrip 352 overlaps at least a portion of the second stripline 312. In an embodiment, at least a portion of the microstrip 352 overlaps at least a portion of the first stripline 302 and at least a portion of the second stripline 312.

As with the chip capacitor 304, the capacitive element (e.g., 216, FIG. 2) of chip capacitor 314 is selected to be a relatively high-Q surface mount capacitor, such as a MIM capacitor, a capacitor integrated within an IPD, a capacitor integrated within a LTCC device, or another type of surface mount capacitor. The inductive element (e.g., 218, FIG. 2) of chip capacitor 314 may be formed together with the capacitive element in the chip capacitor 314. Alternatively, the inductive element may be implemented separate from chip capacitor 314.

According to an embodiment, the first stub circuit (e.g., stub circuit 154, FIG. 2) may be characterized as a 90-degree shorting stub. The dimensions of stripline 302 (e.g., length, width, thickness), and capacitance and inductance values of chip capacitor 304 are chosen such that first stub circuit has an electrical length of approximately 90 degrees and functions as an open circuit at a fundamental frequency, $F_O$, and functions as a second harmonic frequency, $2*F_O$, shunt to the ground reference voltage. Likewise, the second stub circuit (e.g., stub circuit 156, FIG. 2) may be characterized as a 60-degree shorting stub. The dimensions of stripline 312 (e.g., length, width, thickness), and capacitance and inductance values of chip capacitor 314 are chosen such that the second stub circuit has an electrical length of approximately 60 degrees and functions as a third harmonic frequency, $3*F_O$, shunt to the ground reference voltage to the output of the peaking amplifier die 342 and as an open circuit to the output of the carrier amplifier die 332.

Generally, there is provided, an amplifier module including a multi-layer printed circuit board (PCB); a first power transistor die mounted at a top surface of the multi-layer PCB; a second power transistor die mounted at the top surface of the multi-layer PCB; an impedance inversion element coupled between an output of the first power transistor die and an output of the second power transistor die, a combining node formed at the output of the second power transistor die; and a first stub circuit coupled at the combining node, the first stub circuit including a first transmission line element having a first end coupled to the combining node. The first transmission line element may be formed as a first stripline, the first stripline formed from a first inner conductive layer of the multi-layer PCB. The impedance inversion element may include a microstrip formed from a top conductive layer of the multi-layer PCB, at least a portion of the microstrip overlaps at least a portion of the first stripline. The first stub circuit may be configured to function as an open circuit at a fundamental frequency ($F_O$) and as a shunt to a ground reference voltage at a second harmonic frequency ($2*F_O$). The first stub circuit may further include a first capacitor, a first terminal of the first capacitor coupled to a second end of the first stripline. The first capacitor may include a surface mount capacitor mounted at the top surface of the multi-layer PCB. The surface mount capacitor may include a metal-insulator-metal (MIM) capacitor. The first stub circuit may further include an inductor coupled to the MIM capacitor. The module may further include a second stub circuit coupled at the combining node in parallel with the first stub circuit, the second stub circuit including a second stripline formed from a different inner conductive layer of the multi-layer PCB than the first stripline. The second stub circuit may be configured to function at a third harmonic frequency ($3*F_O$) as a shunt to a ground reference voltage at the output of the second power transistor die and as an open circuit at the output of the first power transistor die. The first power transistor die may be configured to operate in a class AB mode and the second power transistor die may be configured to operate in a class C mode.

In another embodiment, there is provided, an amplifier module including a multi-layer printed circuit board (PCB); a first power transistor die mounted at a top surface of the multi-layer PCB, the first power transistor die configured as a carrier amplifier; a second power transistor die mounted at the top surface of the multi-layer PCB, the second power transistor die configured as a peaking amplifier; an impedance inversion element coupled between an output of the first power transistor die and an output of the second power transistor die, a combining node formed at the output of the second power transistor die; and a first stub circuit coupled at the combining node, the first stub circuit comprising a first stripline having a first end coupled at the combining node. The second power transistor die may be oriented in a direction different from the first power transistor die. The module may further include a second stub circuit coupled at the combining node in parallel with the first stub circuit, the second stub circuit comprising a second stripline having a first end coupled at the combining node. The first stripline may be formed from a first inner conductive layer of the multi-layer PCB and the second stripline may be formed from a second inner conductive layer of the multi-layer PCB. The impedance inversion element may include a microstrip formed from a top conductive layer of the multi-layer PCB, at least a portion of the microstrip overlaps at least a portion of the first stripline and at least a portion of the second stripline. The first stub circuit may be configured to have an electrical length of approximately 90 degrees and the second stub circuit may be configured to have an electrical length of approximately 60 degrees.

In yet another embodiment, there is provided, a Doherty amplifier including a multi-layer printed circuit board (PCB); a carrier amplifier die mounted at a top surface of the multi-layer PCB; a peaking amplifier die mounted at the top surface of the multi-layer PCB; an impedance inversion element coupled between a drain terminal of the carrier amplifier die and a drain terminal of the peaking amplifier die, a combining node formed at the drain terminal of the peaking amplifier die; and a first stub circuit coupled at the combining node, the first stub circuit comprising a first stripline formed from a first conductive layer of the PCB. The first stub circuit may be configured to function as an open circuit at a fundamental frequency ($F_O$) and as a shunt to a ground reference voltage at a second harmonic frequency ($2*F_O$). The amplifier may further include a second stub circuit coupled at the combining node in parallel with the first stub circuit, the second stub circuit comprising a second stripline formed from a second conductive layer of the PCB, the second conductive layer different from the first conductive layer.

By now it should be appreciated that there has been provided, a 90/0 Doherty amplifier implementation that controls $2^{nd}$ and $3^{rd}$ harmonics for optimal performance, efficiency, and power. The amplifier includes a first shorting stub circuit and a second shorting stub circuit coupled in parallel at the combining/common node of the amplifier. The first stub circuit is configured to have an electrical length of approximately 90 degrees and functions as an open circuit at a fundamental frequency, $F_O$, and functions as a second harmonic frequency, $2*F_O$, shunt (short circuit) to the ground reference voltage. Likewise, the second stub circuit is configured to have an electrical length of approximately 60 degrees. The second stub circuit functions as a third harmonic frequency, $3*F_O$, shunt to the ground reference voltage to the output of the peaking amplifier die and as an open circuit to the output of the carrier amplifier die of the Doherty amplifier. A Cds absorbed impedance inverter coupled between outputs of the peaking and carrier amplifiers is used to rotate the $F_0$, $2*F_0$, and $3*F_0$ combining/common node impedance to terminate the carrier amplifier harmonics.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An amplifier module comprising:
a multi-layer printed circuit board (PCB);
a first power transistor die mounted at a top surface of the multi-layer PCB;
a second power transistor die mounted at the top surface of the multi-layer PCB;
an impedance inversion element coupled between an output of the first power transistor die and an output of the second power transistor die, a combining node formed at the output of the second power transistor die; and
a first stub circuit coupled at the combining node, the first stub circuit comprising a first transmission line element having a first end coupled to the combining node, the first stub circuit configured to have an electrical length of approximately 90 degrees; and
a second stub circuit coupled at the combining node in parallel with the first stub circuit, the second stub circuit configured to have an electrical length of approximately 60 degrees.

2. The module of claim 1, wherein the first transmission line element is formed as a first stripline, the first stripline formed from a first inner conductive layer of the multi-layer PCB.

3. The module of claim 2, wherein the impedance inversion element comprises a microstrip formed from a top conductive layer of the multi-layer PCB, at least a portion of the microstrip overlaps at least a portion of the first stripline.

4. The module of claim 1, wherein the first stub circuit is configured to function as an open circuit at a fundamental frequency ($F_0$) and as a shunt to a ground reference voltage at a second harmonic frequency ($2*F_0$).

5. The module of claim 1, wherein the first stub circuit further comprises a first capacitor, a first terminal of the first capacitor coupled to a second end of the first stripline.

6. The module of claim 5, wherein the first capacitor comprises a surface mount capacitor mounted at the top surface of the multi-layer PCB.

7. The module of claim 6, wherein the surface mount capacitor comprises a metal-insulator-metal (MIM) capacitor.

8. The module of claim 7, wherein the first stub circuit further comprises an inductor coupled to the MIM capacitor.

9. The module of claim 2, wherein the second stub circuit comprises a second stripline formed from a different inner conductive layer of the multi-layer PCB than the first stripline.

10. The module of claim 9, wherein the second stub circuit is configured to function at a third harmonic frequency ($3*F_0$) as a shunt to a ground reference voltage at the output of the second power transistor die and as an open circuit at the output of the first power transistor die.

11. The module of claim 1, wherein the first power transistor die is configured to operate in a class AB mode and the second power transistor die is configured to operate in a class C mode.

12. An amplifier module comprising:
a multi-layer printed circuit board (PCB);
a first power transistor die mounted at a top surface of the multi-layer PCB, the first power transistor die configured as a carrier amplifier;
a second power transistor die mounted at the top surface of the multi-layer PCB, the second power transistor die configured as a peaking amplifier;
an impedance inversion element coupled between an output of the first power transistor die and an output of the second power transistor die, a combining node formed at the output of the second power transistor die;
a first stub circuit coupled at the combining node, the first stub circuit comprising a first stripline having a first end coupled at the combining node, the first stub circuit configured to have an electrical length of approximately 90 degrees; and
a second stub circuit coupled at the combining node in parallel with the first stub circuit, the second stub circuit comprising a second stripline having a first end coupled at the combining node, the second stub circuit configured to have an electrical length of approximately 60 degrees.

13. The module of claim 12, wherein the second power transistor die is oriented in a direction different from the first power transistor die.

14. The module of claim 12, wherein the first stripline is formed from a first inner conductive layer of the multi-layer PCB and the second stripline is formed from a second inner conductive layer of the multi-layer PCB.

15. The module of claim 12, wherein the impedance inversion element comprises a microstrip formed from a top conductive layer of the multi-layer PCB, at least a portion of the microstrip overlaps at least a portion of the first stripline and at least a portion of the second stripline.

16. A Doherty amplifier comprising:
a multi-layer printed circuit board (PCB);
a carrier amplifier die mounted at a top surface of the multi-layer PCB;
a peaking amplifier die mounted at the top surface of the multi-layer PCB;
an impedance inversion element coupled between a drain terminal of the carrier amplifier die and a drain terminal of the peaking amplifier die, a combining node formed at the drain terminal of the peaking amplifier die;
a first stub circuit coupled at the combining node, the first stub circuit comprising a first stripline formed from a first conductive layer of the PCB, the first stub circuit configured to have an electrical length of approximately 90 degrees; and
a second stub circuit coupled at the combining node in parallel with the first stub circuit, the second stub circuit comprising a second stripline formed from a second conductive layer of the PCB different from the first conductive layer, the second stub circuit configured to have an electrical length of approximately 60 degrees.

17. The amplifier of claim 16, wherein the first stub circuit is configured to function as an open circuit at a fundamental frequency ($F_0$) and as a shunt to a ground reference voltage at a second harmonic frequency ($2*F_0$).

18. The amplifier of claim 16, wherein the second stub circuit is configured to function at a third harmonic frequency ($3*F_0$) as a shunt to a ground reference voltage at the output of the second power transistor die and as an open circuit at the output of the first power transistor die.

19. The amplifier of claim 16, wherein the impedance inversion element comprises a microstrip formed from a top conductive layer of the multi-layer PCB, at least a portion of the microstrip overlaps at least a portion of the first stripline and at least a portion of the second stripline.

20. The amplifier of claim 16, wherein the first stub circuit further comprises:
a capacitor, a first terminal of the capacitor coupled to a second end of the first stripline; and
an inductor coupled to the capacitor.

* * * * *